(12) United States Patent
Kim et al.

(10) Patent No.: US 9,070,800 B2
(45) Date of Patent: Jun. 30, 2015

(54) SOLAR CELL AND TEXTURING METHOD THEREOF

(75) Inventors: Jinsung Kim, Seoul (KR); Chulchae Choi, Seoul (KR); Changseo Park, Seoul (KR); Jaewon Chang, Seoul (KR); Hyungseok Kim, Seoul (KR); Youngho Choe, Seoul (KR); Philwon Yoon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 1144 days.

(21) Appl. No.: 12/557,480

(22) Filed: Sep. 10, 2009

(65) Prior Publication Data

US 2010/0065117 A1 Mar. 18, 2010

(30) Foreign Application Priority Data

Sep. 16, 2008 (KR) .......... 10-2008-0090699
Mar. 11, 2009 (KR) .......... 10-2009-0020534

(51) Int. Cl.
*H01L 31/00* (2006.01)
*H01L 31/0236* (2006.01)
*H01L 31/0352* (2006.01)
*H01L 31/068* (2012.01)
*H01L 31/18* (2006.01)

(52) U.S. Cl.
CPC ...... *H01L 31/0236* (2013.01); *H01L 31/03529* (2013.01); *H01L 31/068* (2013.01); *H01L 31/1804* (2013.01); *Y02E 10/547* (2013.01)

(58) Field of Classification Search
USPC ......... 136/256; 257/E21.214, E31.13; 438/71
See application file for complete search history.

(56) References Cited

U.S. PATENT DOCUMENTS

| | | | | |
|---|---|---|---|---|
| 4,664,748 | A | * | 5/1987 | Ueno et al. ............ 216/51 |
| 5,256,597 | A | * | 10/1993 | Gambino ............ 438/625 |
| 2002/0129850 | A1 | * | 9/2002 | Nomura ............ 136/251 |
| 2008/0001243 | A1 | | 1/2008 | Otake et al. |
| 2008/0289685 | A1 | * | 11/2008 | Chen et al. ............ 136/256 |
| 2009/0199898 | A1 | | 8/2009 | Do et al. |
| 2009/0305456 | A1 | | 12/2009 | Funakoshi |

FOREIGN PATENT DOCUMENTS

| | | | | |
|---|---|---|---|---|
| EP | 1956659 | * | 8/2008 | ....... H01L 31/04 |
| JP | 3-150501 | * | 6/1991 | ....... G02B 1/10 |
| JP | 8-85874 | A | 4/1996 | |
| JP | 11-233484 | A | 8/1999 | |
| JP | 2001-15782 | A | 1/2001 | |
| JP | 2005-108965 | A | 4/2005 | |
| JP | 2006-202831 | A | 8/2006 | |

(Continued)

*Primary Examiner* — Thanh-Truc Trinh
(74) *Attorney, Agent, or Firm* — Birch, Stewart, Kolasch & Birch, LLP

(57) ABSTRACT

The present invention relates to a solar cell. The solar cell includes a substrate of a first conductive type, the substrate having a textured surface on which a plurality of projected portions are formed, and surfaces of the projected portions having at least one of a plurality of particles attached thereto and a plurality of depressions formed thereon; an emitter layer of a second conductive type opposite the first conductive type, the emitter layer being positioned in the substrate so that the emitter layer has the textured surface; an anti-reflection layer positioned on the emitter layer which has the textured surface and including at least one layer; a plurality of first electrodes electrically connected to the emitter layer; and at least one second electrode electrically connected to the substrate.

7 Claims, 11 Drawing Sheets

(56) References Cited

FOREIGN PATENT DOCUMENTS

| | | |
|---|---|---|
| JP | 2007-88254 A | 4/2007 |
| JP | 2007-194485 A | 8/2007 |
| KR | 10-2008-0029177 A | 4/2008 |
| KR | 10-2008-0051145 A | 6/2008 |
| KR | 10-2009-0087665 A | 8/2009 |

* cited by examiner

SOLAR CELL AND TEXTURING METHOD THEREOF

This application claims priority to and the benefit of Korean Patent Application No. 10-2008-0090699 filed in the Korean Intellectual Property Office on Sep. 16, 2008 and 10-2009-0020534 filed in the Korean Intellectual Property Office on Mar. 11, 2009, the entire contents of which are incorporated herein by reference.

BACKGROUND OF THE INVENTION

1. Field of the Invention

Embodiments of the present invention relate to a solar cell and a texturing method thereof.

2. Description of the Related Art

Recently, as existing energy sources such as petroleum and coal are expected to be depleted, interests in alternative energy sources for replacing the existing energy sources are increasing. Among the alternative energy sources, solar cells have been particularly spotlighted because, as cells for generating electric energy from solar energy, the solar cells are able to draw energy from an abundant source and do not cause environmental pollution. A general solar cell includes a substrate and an emitter layer, formed of a semiconductor, each having a different conductive type such as a p-type and an n-type, and electrodes respectively formed on the substrate and the emitter layer. The general solar cell also includes a p-n junction formed at an interface between the substrate and the emitter layer.

When light is incident on the solar cell, a plurality of electron-hole pairs are generated in the semiconductor. Each of the electron-hole pairs is separated into electrons and holes by the photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires to thereby obtain an electric power.

For improving a conversion efficiency of the solar cell for, which converts light energy into electric energy, a texturing process is performed on a surface of the semiconductor, to decrease reflection of light incident on the semiconductor

SUMMARY OF THE INVENTION

In one aspect, there is a solar cell including a substrate of a first conductive type, the substrate having a textured surface on which a plurality of particles are attached, an emitter layer of a second conductive type opposite the first conductive type, the emitter layer being positioned in the substrate, an anti-reflection layer positioned on the emitter layer which has the textured surface and including at least one layer, a plurality of first electrodes electrically connected to the emitter layer, and at least one second electrode electrically connected to the substrate.

In another aspect, there is a solar cell including a substrate of a first conductive type, the substrate having a textured surface with a plurality of projected portions, an emitter layer of a second conductive type opposite the first conductive type on the substrate, a plurality of first electrodes electrically connected to the emitter layer, and at least one second electrode electrically connected to the substrate, wherein the textured surface comprises a plurality of depressions.

In another aspect, there is a texturing method of a solar cell including forming a textured surface on a substrate, forming a particle formation layer on the textured surface, the particle formation layer comprising a particle formation material and a medium material, and removing the medium material from the particle formation layer to position a plurality of particles on the textured surface.

In further another aspect, there is a texturing method of a solar cell including forming a textured surface on a substrate, and supplying a plurality of metal particles on the textured surface and forming a plurality of depressions on the textured surface using a catalytic action by the plurality of metal particles.

In another aspect, there is a solar cell including a substrate of a first conductive type, the substrate having a textured surface on which a plurality of projected portions are formed, and surfaces of the projected portions having at least one of a plurality of particles attached thereto and a plurality of depressions formed thereon; an emitter layer of a second conductive type opposite the first conductive type, the emitter layer being positioned in the substrate so that the emitter layer has the textured surface; an anti-reflection layer positioned on the emitter layer which has the textured surface and including at least one layer; a plurality of first electrodes electrically connected to the emitter layer; and at least one second electrode electrically connected to the substrate.

In another aspect, there is a texturing method of a solar cell including forming a textured surface on a substrate for the solar cell to provide a plurality of projected portions; and providing a plurality of particles on the textured surface.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
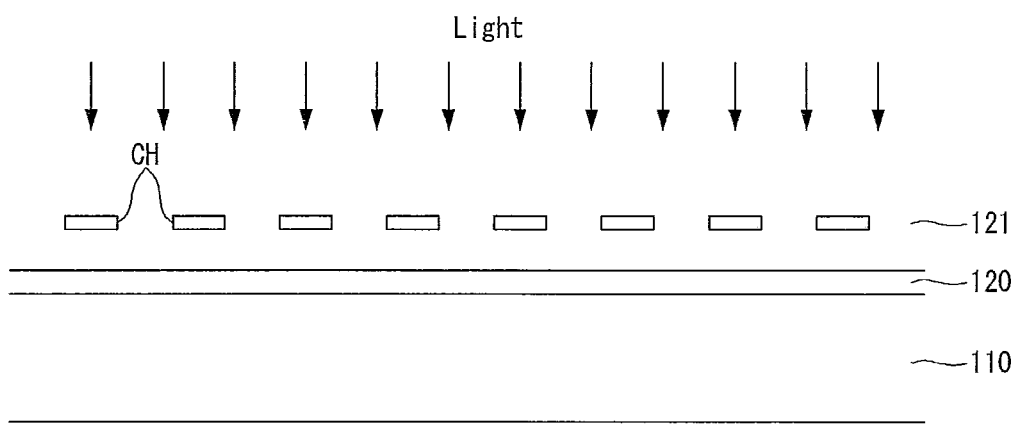
FIGS. 1 to 5 are cross-sectional views sequentially showing each of steps in an example of a texturing method of a semiconductor substrate according to an example embodiment of the present invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A solar cell and a manufacturing of the solar cell according to example embodiments of the present invention will now be described with reference to the accompanying drawings.

First, a texturing method of a semiconductor substrate according to an example embodiment of the present invention will be described in detail with reference to FIGS. 1 to 7.

Figure 4:
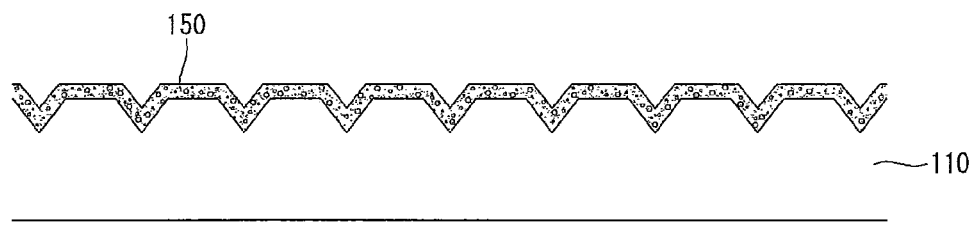
Figure 5:
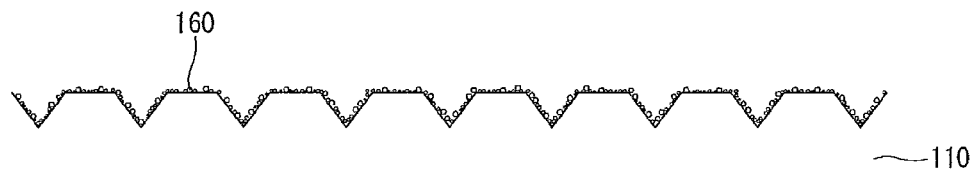
Figure 6:
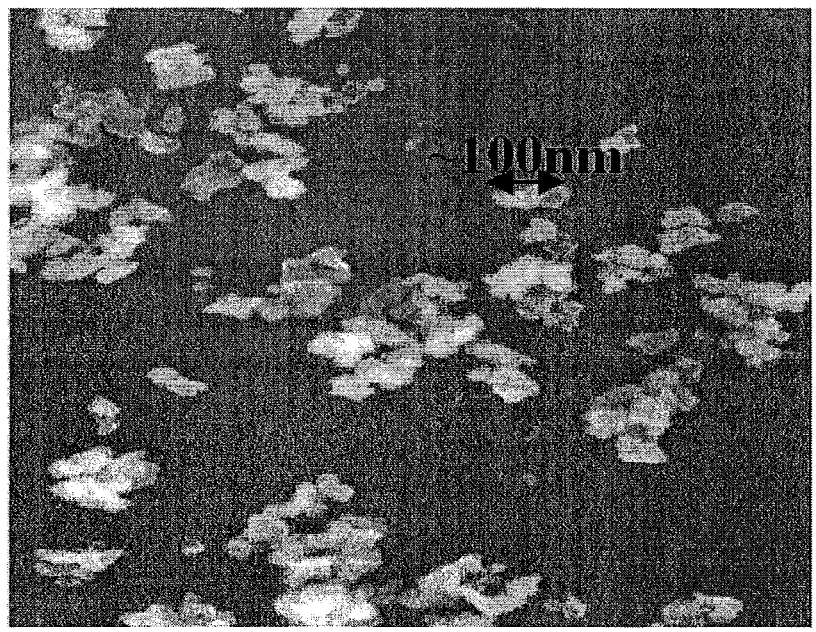
FIG. 6 is an SEM picture showing particles attached on a textured surface of a substrate.
Figure 7:
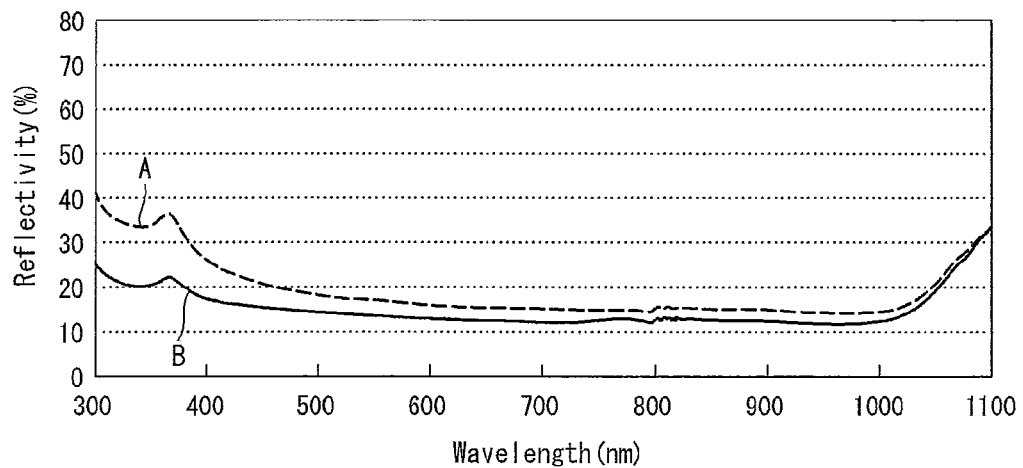
FIG. 7 shows reflectance curves of light incident on a substrate having a textured surface with particles according to an example embodiment of the present invention and a substrate having a textured surface without the particles according to a related art, respectively.

FIGS. 1 to 5 are cross-sectional views sequentially showing each of steps in an example of a texturing method of a semiconductor substrate according to an example embodiment of the present invention, FIG. 6 is an SEM picture showing particles attached on a textured surface of a substrate, and FIG. 7 shows reflectance curves of light incident on a substrate having a textured surface with particles according to an example embodiment of the present invention and a substrate having a textured surface without the particles according to a related art, respectively.

Referring to FIG. 1, a photoresist 120 is formed on a substrate 110 preferably, but not necessarily, made of a semiconductor such as silicon, and then a photomask 121 is arranged on the substrate 110. The photo mask 121 includes a plurality of light transmitting portions CH, which are preferably, but not necessarily, made of a transparent material or are openings.

Figure 2:
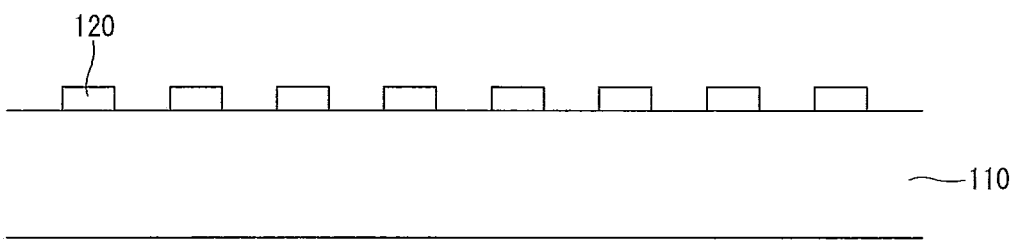

Light is irradiated through the photomask 121 onto the photoresist 120 and then the photoresist 120 is developed. Thereby, as shown in FIG. 2, portions of the photoresist 120 which are exposed to light through the light transmitting portions CH of the photo mask 121 are removed such that portions of the substrate 110 are exposed, while portions of the photoresist 120 which are not exposed to light are remained in place.

Figure 3:
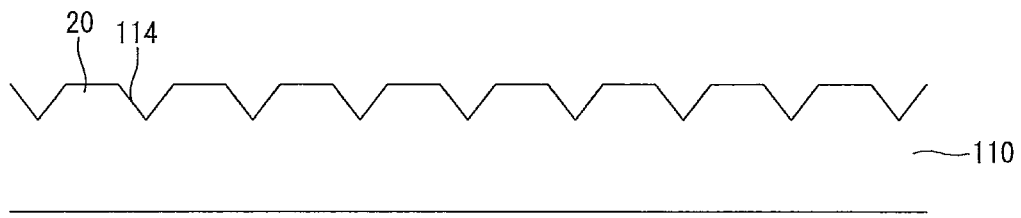

Next, referring to FIG. 3, the exposed portions of the substrate 110 using the remaining portions of the photoresist 120 as a mask are etched to form a textured surface on the substrate 110, and then the remaining portions of the photoresist film 120 are removed. At this time, the exposed portions of the substrate 110 are etched by an anisotropy etching process having a difference etch rate in accordance with crystalline directions of the substrate 110.

Thereby, as shown in FIG. 3, since an etch rate of a (111) crystalline direction differs from an etch rate of another crystalline direction (100), a plurality of grooves 114 are formed on the surface of the substrate 110. At this time, lateral sides of the grooves 114 are inclined relative to the surface of the substrate 110. By forming a plurality of grooves 114 through the etching, a plurality of projected portions 20 is formed.

The etching process for the formation of the grooves 114 may be performed by a wet etching process using an etchant such as NaOH, KOH, $H_2O$, isopropyl alcohol, or TMAH (Tetramethyl ammonium hydroxide), a dry etching process using $CHF_3$ or $SF_6$, or a mechanical etching process using a laser beam, etc. In this embodiment, the textured surface is formed by an anisotropy etching, but may be formed by an isotropy etching.

Further, in an alternative embodiment, the surface of the substrate 110 may be textured by wet etching, dry etching, or mechanical etching processes, etc., to form the textured surface. Thereby, in forming the textured surface without the photoresist 120 and the photomask 121, the processes shown in FIGS. 1 and 2 are not performed.

Further, in another alternative embodiment, after forming a separate protection layer on one surface of the substrate, the etching may be performed to form the textured surface on another surface of the substrate 110 or the etching may be performed to form the textured surface on the entire surface of the substrate 110.

As described above, when the textured surface having the plurality of grooves 114 is formed on the substrate 110, light incident on the substrate 110 is scattered to increase incident and reflection operations and to thereby improve the incident ratio of light toward the substrate 110.

As shown in FIG. 4, a mixed material is deposited on the textured surface of the substrate 110 to form a particle formation layer 150. The mixed material includes a particle formation material containing the same material as the substrate 110 and a medium material.

In this embodiment, since the substrate 110 is made of silicon, the particle formation material is made of silicon. However, the particle formation material is not limited thereto and the particle formation material may be made of another material. The particle formation material may be fine lumps of silicon having regular or irregular shapes.

The mixed material contains the medium material of about 90 wt % to 99 wt % and the particle formation material of about 10 wt % to 1 wt %, based on a total weight. However, the ratios of the mixed material and the particle formation material contained in the mixed material may be varied so that the medium material of less than 90 wt % and/or particle formation material of more than 10 wt % is also possible.

When an amount of particle formation material is less than about 1 wt %, an amount of particles formed on the substrate 110 is too small, and difficult to obtain an effective scattering effect of light incident on the substrate 110. On the contrary, when the amount of particle formation material is more than about 10 wt %, the amount of particles formed on the substrate 110 is more than a necessary amount, such that light is reflected by the formed particles.

The medium material is mixed to the particle formation material and is capable of being deposited on the substrate 110. In this embodiment, the medium material includes a plurality of metal particles such as aluminum (Al) or chromium (Cr). In this embodiment, the particle formation layer 150 is formed by a sputtering process using the mixed material as a target, but may be formed by various processes such as a chemical vapor deposition (CVD).

Next, referring to FIG. 5, the medium material contained in the particle formation layer 150 is removed using an etchant such that the particles 160 are mainly left on the surface of the substrate 110.

As described above, since the particle formation material is made of the same material as the substrate 110, the particles 160 contain silicon and thereby the particles 160 are stably attached on the surface of the substrate 110.

A kind of etchant for removing the medium material is changed depending on a kind of the medium material. For example, when the medium material is made of aluminum (Al), the etchant containing aluminum may be used, and when the medium material is made of chromium (Cr), the etchant containing chromium may be used.

For removing only the medium material, the removal process of the medium material is performed in a predetermined temperature. In this embodiment, the removal process of the medium material is performed at about 25° C. to 50° C. When the temperature is less than about 25° C., the removal process of the medium material may be not normally performed. When the temperature is more than about 50° C., the particle formation material as well as the medium material may be removed.

In this embodiment, diameters (sizes) of particles 160 are changed according to a thickness of the particle formation layer 150, as shown in [Table 1]

TABLE 1

| Thickness | Diameter of a particle |
|---|---|
| about 1 μm | about 200 nm |
| about 700 nm | about 100 nm |
| about 400 nm | about 50 nm |
| about 200 nm | about 20 to 30 nm |

When the diameter of the particle 160 attached on the surface of the substrate 110 is less than about 50 nm, the scattering of light is reduced since the diameter of the particle is too small. Thus, in this embodiment, the particles 160 have diameters of more than about 50 nm, respectively.

Further, the diameters of particles 160 may be less than a wavelength of light (or a particular wavelength band of light). That is, when the diameter of each particle 160 is less than the wavelength of light, the incident light is scattered by the particles 160, to thereby improve the incident efficiency on the substrate 110. In general, since the wavelength of light incident on the substrate 110 is about 300 nm to 1000 nm, the diameter of the particle 160 is equal to or less than about 300 nm.

FIG. 6 is an SEM photograph showing the particles 160 attached on the substrate 110. In FIG. 6, the particles 160 have the diameter of about 100 nm, respectively and are conglomerated or scattered. In the embodiment, the particles 160 are lumped into separate groups of particles and/or the particles may be encrusted on the surface of the substrate 110. When the particles 160 made of the same material as the substrate 110 are attached on the textured surface of the substrate 110, reflectance curves with respect to the incident light are shown in FIG. 7.

In FIG. 7, a graph "A" is a reflectance curve of light on a textured surface, a graph "B" is a reflectance curve of light on the textured surface with the particles 160 according to an embodiment of the present invention. In FIG. 7, a horizontal axis represents a wavelength of light and a vertical axis represents the reflectance (%). As shown in FIG. 7, when light had a wavelength of about 300 nm to 1000 nm, a reflectance of light in a case "B" in which light was reflected on the textured surface with the particles 160 was lower than a reflectance of light in a case "A" in which light was reflected on the textured surface without the particles 160.

That is, the scattering effect of the incident light is increased by the particles 160 attached on the textured surface, and thereby a reflection prevention efficiency of the incident light on the substrate 110 is improved to increase an amount of incident light on the substrate 110.

Next, referring to FIGS. 8 to 18, another example of a texturing method of the silicon substrate according to an example embodiment of the present invention will be now described.

Figure 12:
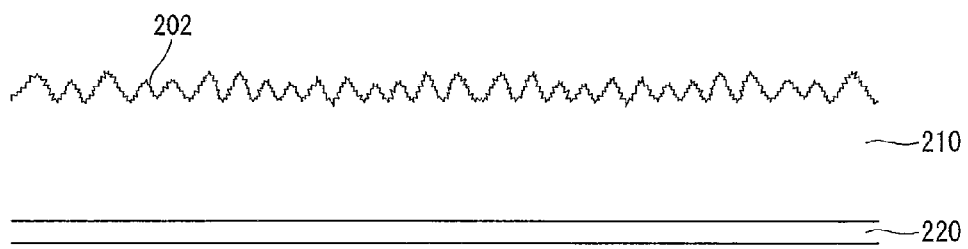
Figure 13:
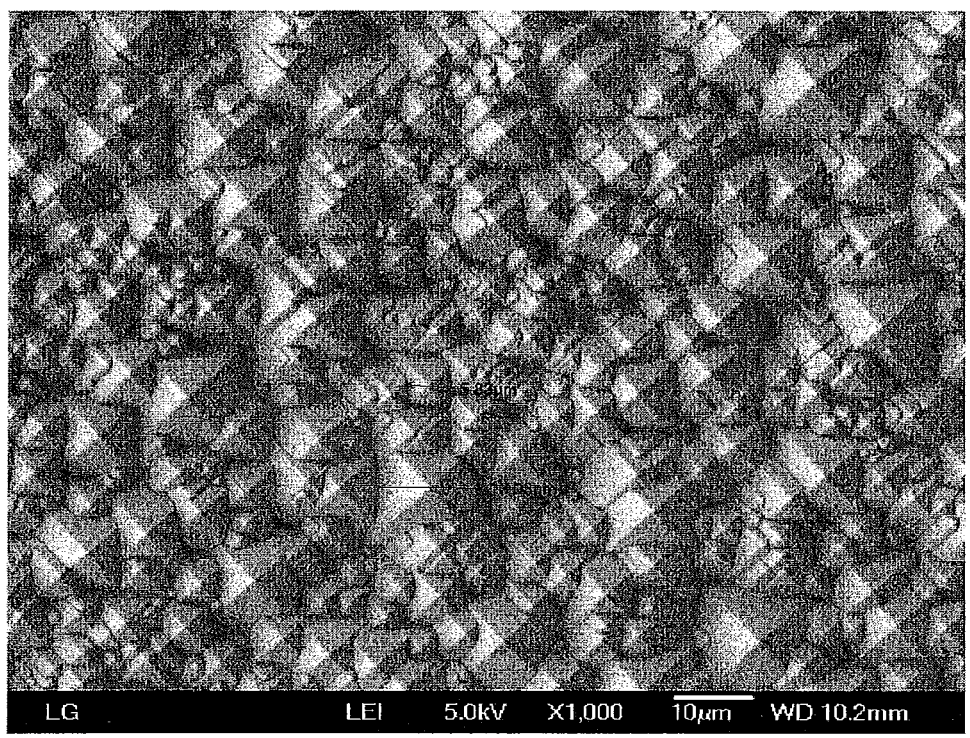
FIG. 13 is a planer view of a portion of a conventional textured surface of a substrate.
Figure 14:
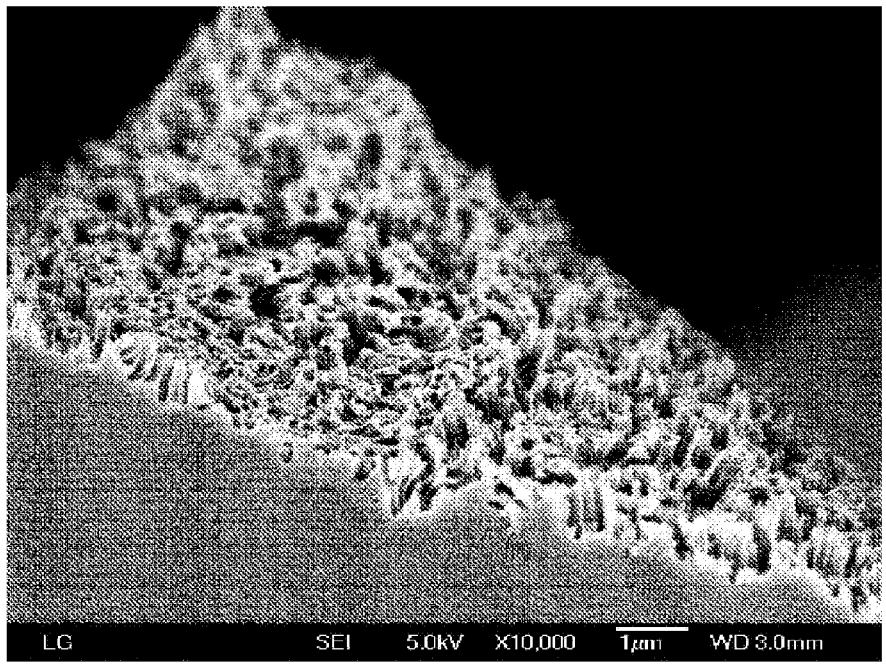
FIGS. 14 and 15 are a cross-sectional view and a planner view of a portion of a textured surface of a substrate by another example of a texturing method a semiconductor substrate according to an example embodiment of the present invention, respectively.
Figure 15:
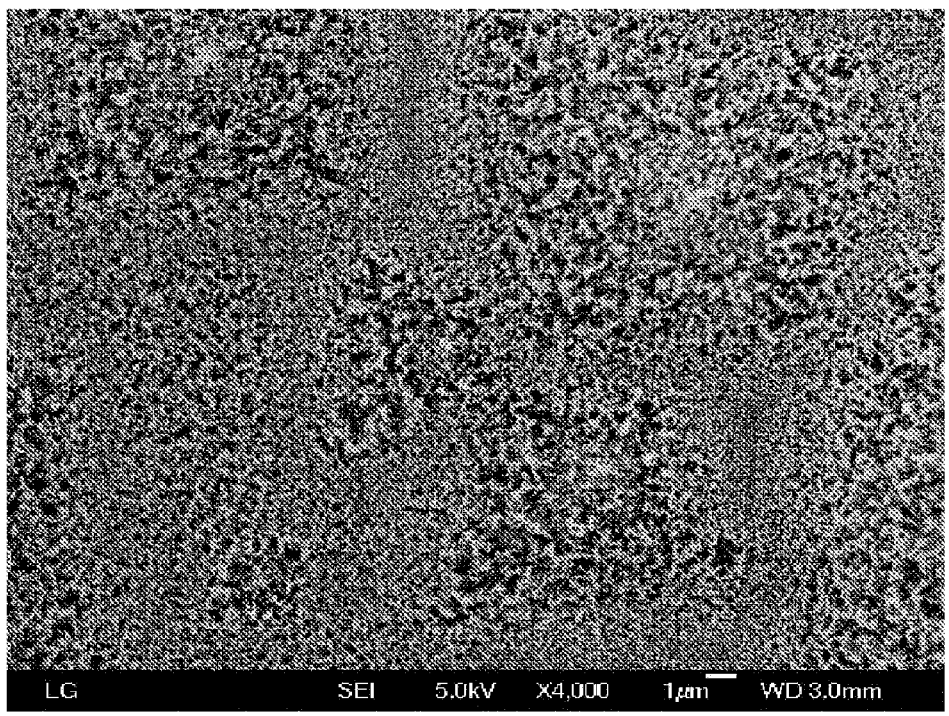
Figure 16:
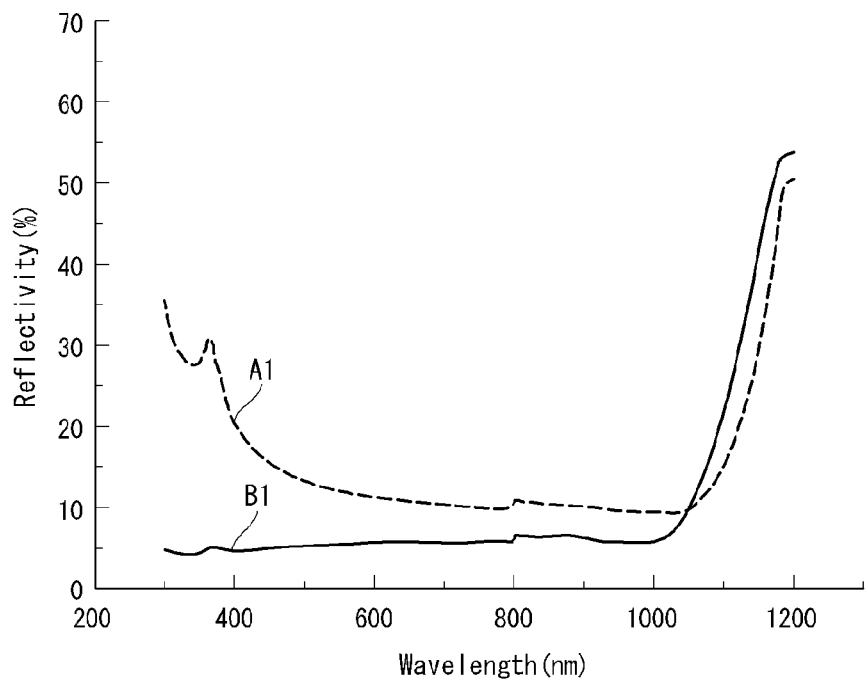
FIG. 16 shows reflectance curves of light incident on a substrate having a textured surface and a substrate having a textured surface with a plurality of grooves, respectively.
Figure 17:
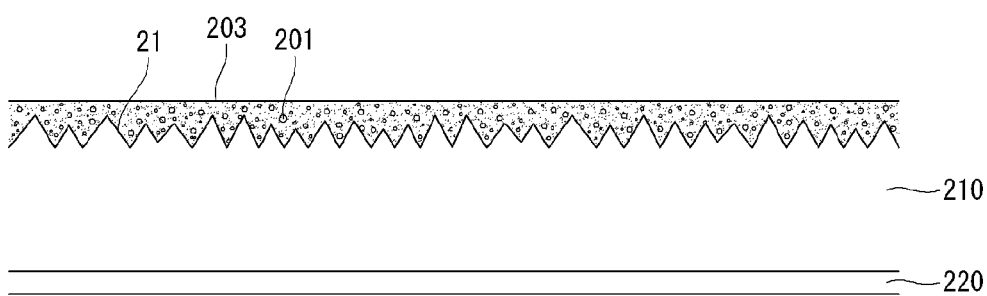
FIGS. 17 and 18 are cross-sectional views showing another method for forming a plurality of grooves on a texturing surface in another example of a texturing method of a semiconductor substrate according to an example embodiment of the present invention.
Figure 18:
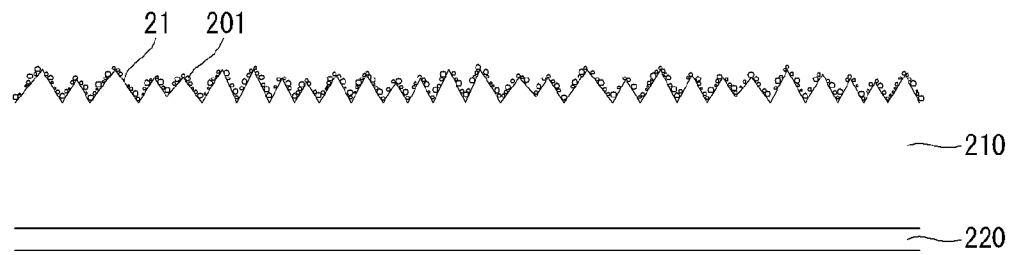

FIGS. 8 to 12 are cross-sectional views sequentially showing each of steps in another example of a texturing method of a semiconductor substrate according to an example embodiment of the present invention, FIG. 13 is a planer view of a portion of a conventional textured surface of a substrate, FIGS. 14 and 15 are a cross-sectional view and a planner view of a portion of a textured surface of a substrate by another example of a texturing method of a semiconductor substrate according to an example embodiment of the present invention, respectively, FIG. 16 shows reflectance curves of light incident on a substrate having a textured surface and a substrate having a textured surface with a plurality of grooves, respectively, and FIGS. 17 and 18 are cross-sectional views showing another method for forming a plurality of grooves on a texturing surface in another example of a texturing method of a semiconductor substrate according to an example embodiment of the present invention.

Figure 8:
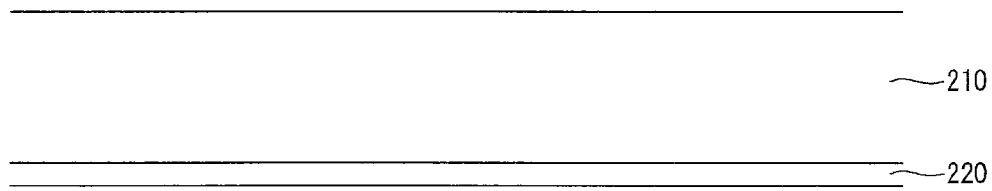
FIGS. 8 to 12 are cross-sectional views sequentially showing each of steps in another example of a texturing method of a semiconductor substrate according to an example embodiment of the present invention.

First, referring to FIG. 8, an etch protection layer 220 is formed on a substrate 210. In this embodiment, the substrate 210 is a semiconductor substrate made of silicon, in particular, single crystal silicon, but may be made of polycrystalline silicon, amorphous silicon, or another material. The etch protection layer 220 is formed on one surface of the substrate 210 to reduce or prevent the one surface from the etching (or from being etched), for example, on a lower surface of the substrate 210 as shown in FIG. 8. In the example, the etch protection layer 220 may be made of silicon oxide (SiOx) or silicon nitride (SiNx), and may be formed by a plasma enhanced chemical vapor deposition (PECVD), etc.

Figure 9:
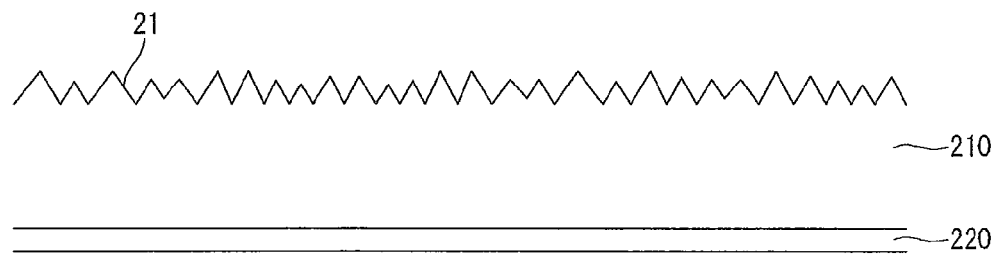

Next, as shown in FIG. 9, a surface on which light is incident, that is, an exposed upper surface of the substrate 210 is etched to form a textured surface having a plurality of projected portions 21. In this example, the substrate 210 is etched by a base solution such as KOH, NaOH, or TMAH, etc., to form the textured surface. The projected portions 21 have a pyramidal shape, respectively as shown in FIG. 13. A diameter of each projected portion 21 is about 1 μm to 20 μm. At this time, the diameter denotes a diameter or a length of a portion of the projected portions 21 abutting on the substrate 210, for example, a base of the pyramidal shaped protruded portions 21. In an alternative example, when the substrate 110 is made of polycrystalline silicon, the substrate 110 may etched by an acid solution such as HF or HNO$_3$, etc., to form the textured surface.

In another alternative example, similar to the description referring to FIGS. 1 to 3, the substrate 210 may be textured using a photoresist and a photomask. In this case, as shown in FIG. 3, the textured surface includes a plurality of projected portions that are flat portions formed between the grooves.

Returning to FIG. 9, in texturing the surface of the substrate 110, the lower surface of the substrate 110 is protected from the etchant by the etch protection layer 220 and thereby is not etched.

Figure 10:
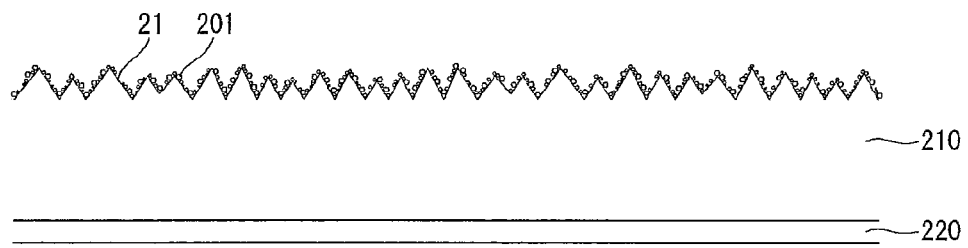
Figure 11:
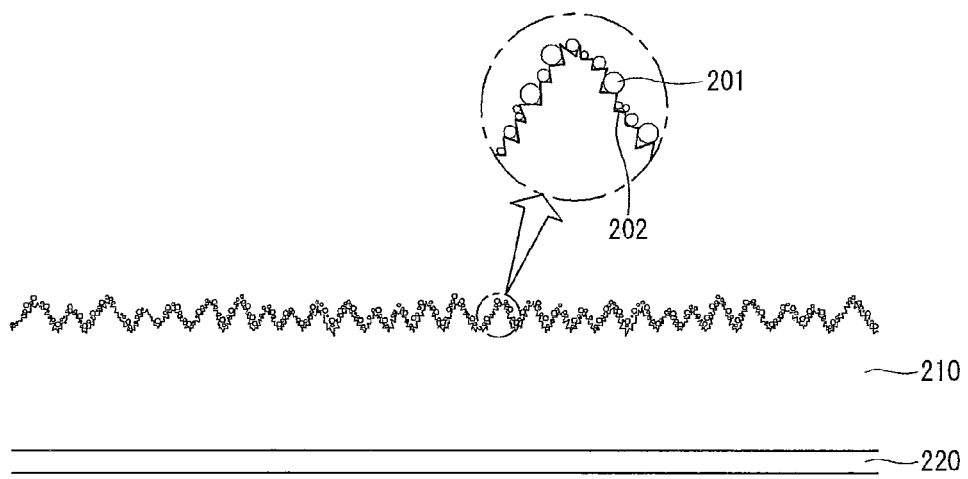

Next, referring to FIG. 10, the upper surface of the substrate 210 is exposed to an etchant containing a plurality of metal particles 201 such as silver (Ag). Each of the metal particles 201 has a diameter of a nano-size level such as about 100 nm to 300 nm. The metal particles 201 may be made of at least one selected from the group consisting of Au, Cu, Al, Pt and Pd or a combination thereof. Like this example, when the metal particles 201 are made of silver (Ag), the metal particles 201 exist as a compound of $AgNO_3$ in the etchant.

Next, when the etchant containing the metal particles 201 is supplied to the textured surface of the substrate 210, a selective etching is performed on the textured surface. At this time, the metal particles 201 are distributed on the textured surface, that is, on the surface of the projected portions 21 due to weights of the metal particles 201, as shown in FIG. 10. Thus, in etching the textured surface, the metal particles 201 function as a catalyst such that a plurality of depressions 202 are formed on surfaces of the projected portions 21 (refer to FIG. 11). In this example, formation positions of the depression 202 are corresponded to positions of the metal particles 201. In embodiments, the depressions 202 may also be described as very small cavities, vesicles, pits, or pockmarks, which are formed on the surfaces of the projected portions 21. In embodiments, the sizes of depressions 202 may vary, and the general shape of the depressions 202 may be hemispherical or tubular, but with very irregular shapes and edges. Accordingly, the projected portions 21 will have serrations (e.g., serrated projections, serrated depressions, or serrated edges) due to the depressions 202.

In detail, due to the catalyst function by the metal particles 201 distributed on the surfaces of the projected portions 21, portions on which the metal particles 201 are attached (or encrusted) are etched faster than portions on which the metal particles 201 are not attached, and thereby the plurality of depressions 202 are formed by an etch rate difference due to the metal particles 201. At this time, an amount of metal particles 201 distributed on the surfaces of the projected portions 21 is changed depending on positions of the projected portions 21, and an etch rate is also changed in accordance with the amount of metal particles 201. Thereby, the depressions 202 have difference shapes. The irregular shapes of the depressions 202 improve the scattering effect of the incident light on the substrate 210 by increasing incident and reflection operations of light on the surface of the substrate 210 and improve the reflection prevention effect of the incident light to increase an amount of light that is incident (not reflected). The depressions 202 formed by the metal particles 201 have a diameter and a depth of a nano-size level such as about 400 nm to 500 nm, respectively.

As described above, each of the projected portions 21 has the pyramidal shape with the diameter of about 1 μm to 20 μm, but the diameter of each depression 202 on the surfaces of the projected portions 21 has the nano-size level of about 400 nm to 500 nm, which is much less than the diameter of the projected portion 21. Accordingly, the depressions 202 are substantially and finely distributed on inclination surfaces of the projected portions 21. FIGS. 14 and 15 show portions of the projected portions 21 with the depressions 202, respectively. FIG. 14 is an SEM picture showing the depression formed on the inclination surface and FIG. 15 is an SEM picture showing a planner view of the textured surface with the depressions according to the example.

The following Reaction formula 1 indicates an example of a reaction mechanism of a catalytic action of the metal particles 201.

[Reaction Formula 1]
Cathodic Reaction (Metal Particles)

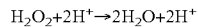

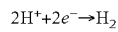

Anodic Reaction (Textured Surface)

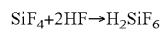

Total Reaction

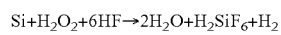

As indicated in the above Reaction Formula 1, when the metal particles 201 are attached on the textured surface having the plurality of projected portions 21, the metal particles 201, for example, locally, accelerates a production of hydrogen ions (H+) dissociated from $H_2O_2$ and relatively decelerates a production of hydrogen ($H_2$). A high concentration of hydrogen ion (H+) accelerates a production of $SiF_4$ on the surfaces of the projected portions 21 showing the anodic reaction to increase an etch rate of the surfaces of the projected portions 21 on which the metal particles 201 are attached.

In forming the depressions 202 on the textured surface with the projected portions 21, an etchant in which HF, $AgNO_3$, and $H_2O_2$ are mixed in a volume ratio of 1:5:10 may be used. A composition ratio of the etchant may be adjusted so as to control an etch rate. In other words, changes in the etch rate may cause changes in depths of the depressions 202 to vary the reflectance of the substrate 210.

FIG. 16 shows graphs of a case in which the depressions 202 were formed on the projected portions 21 and a case in which the depressions were not formed on the projected portions 21. In FIG. 16, a reflectance curve "A1" (a comparison example) of light is for the textured surface of the substrate and a reflectance curve "B1" (an experiment example) of light is for the textured surface having the depressions.

As shown in FIG. 16, the reflectance of the comparison example was about 11% to 12%, and the reflectance of the experiment example was about 5% to 6% in a wavelength band of 500 nm to 1000 nm. Accordingly, the example according to the embodiment reduced the reflectance by about 50% for the noted wavelength band, as compared to the comparison example according to a related art.

After the formation of the plurality of depressions 202 on the projected portions 21, residues of the metal particles 201 remain. The remaining metal particles 201 permeate into the substrate 210 and function as an impurity, and thereby an impurity concentration of the substrate 210 is changed by the remaining metal particles 201. Thus, as shown in FIG. 12, the remaining metal particles 210 are removed after the formation of the plurality of depressions 202. That is, as shown in FIG. 12, the remaining metal particles 201 are removed by an etchant supplied on the textured surface of the substrate 210.

The etchant used to remove the remaining metal particles 201 may depend on a kind of the metal particles 201. For example, in a case in which the remaining metal particles 201 are formed of Au, an etchant obtained by mixing iodine (I) with potassium iodide (KI) may be used. In case that the remaining metal particles 201 are formed of Ag, nitrate-based ($NO_3$) etchant may be used. In case in which the remaining metal particles 201 are formed of Cu, one of bromide-based, chloride-based, nitrate-based, and sulfate-based aqueous solutions, or a mixed aqueous solution thereof may be used as an etchant. In case that the remaining metal particles 201 are formed of Al, an etchant obtained by mixing $H_2SO_4$ with HNO₃ may be used. In case that the remaining metal particles 201 are formed of Pt or Pd, one of chloride-based and nitrate-based aqueous solutions, or a mixed aqueous solution thereof may be used as an etchant. After the removal of the remaining metal particles 201, the etch protection layer 220 on the rear surface of the substrate 210 is removed.

Unlike FIG. 10, in an alternative example, a material containing the metal particles 201 may be applied on the textured surface to form the plurality of depressions 202 by a subsequent application of an etchant.

Next, referring to FIGS. 17 and 18 as well as FIGS. 8 to 9 and 11 to 12, another example for forming the plurality of depressions 202 on the textured surface with the projected portions 21 will be described.

As shown in FIGS. 8 and 9, an etch protection layer 220 is formed on the substrate 210 and a front surface of the substrate 210 on which the etch protection layer 220 is not formed is etched to form a textured surface. Next, as shown in FIG. 17, a material containing a plurality of metal particles 201 is applied on the textured surface of the substrate 210 to form a metal particle layer 203. The metal particle layer 203 includes a plurality of metal particles 201 of a nano-size level, H₂O, and polyvinylpyrrolidone (PVP) that is surfactant. The metal particle layer 203 is applied on surfaces of a plurality of projected portions 21 by various methods such as a screen printing, a spray coating, or a spin coating. The applied metal particle layer 203 is dried for a predetermined time. Thus, during the dry process, the metal particles 201 contained into the metal particle layer 203 sink in a gravity direction, and mixtures such as H₂O and the surfactant are evaporated. Accordingly, as shown in FIG. 18, the metal particles 201 are mainly remained on the surfaces of the projected portions 21. As described above, the metal particles 201 may be at least one selected from the group consisting of Au, Cu, Al, Pt and Pd or a combination thereof and each of the metal particles 201 has a diameter of a nano-size level such as about 100 nm to 300 nm.

In a state in which the metal particles 201 are attached on the surfaces of the projected portions 21, the textured surface of the substrate 210 is etched by an etchant supplied to the substrate 210. Thereby, as described above, by the catalytic action of the metal particles 201, an etch rate difference between portions of the textured surface on which the metal particles 201 are attached and portions of the textured surface on which the metal particles 201 are not attached occurs. Accordingly, a plurality of depressions 202 of irregular shapes are formed on the surface of the projected portions 21 on which the metal particles 201 are attached by the etch rate difference (refer to FIG. 11). After the formation of the depressions 202, the remaining metal particles 201 are removed and then the etch protection layer 220 is also removed (refer to FIG. 12).

In this example, only the exposed surface of the substrate 110 not covered by the etch protection layer 220 is etched to form the textured surface, but in an alternative example, the textured surface without the etch protection layer 220 may be on a surface or the total surface of the substrate 110. When the textured surface is formed on the total surface of the substrate 110, the plurality of depressions 202 may be on the total surface of the substrate 110. The semiconductor substrate textured according to the above examples may be used to manufacture a solar cell.

When the surface of the semiconductor substrate 110 or 210 is textured using the method with reference to FIGS. 1 to 18, a solar cell using the textured substrate 110 or 210 will be described.

Figure 19:
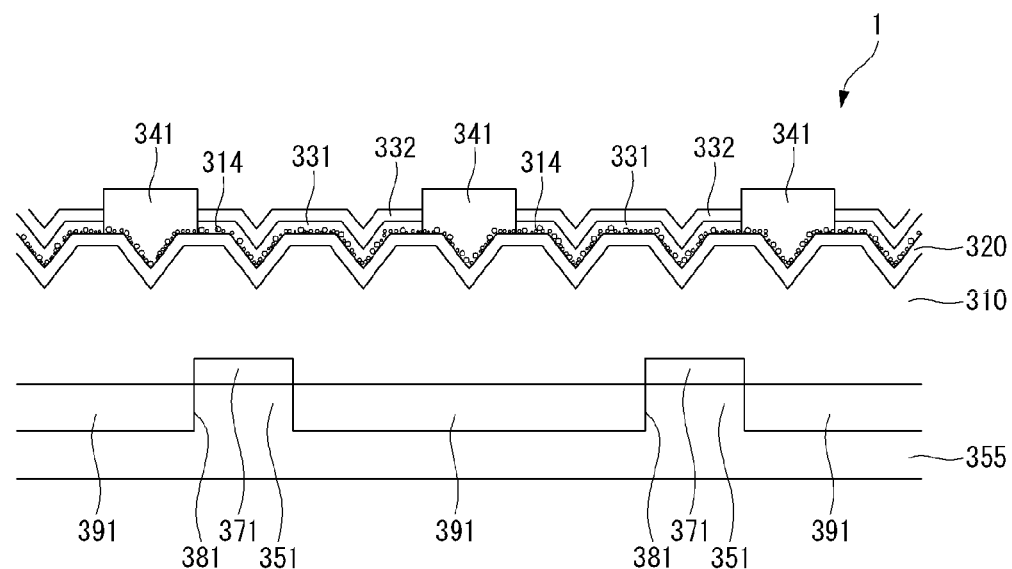
FIG. 19 is a partial cross-sectional view of a solar cell manufactured using the texturing method of FIGS. 1 to 5.

Referring to FIG. 19, a solar cell manufactured by using the texturing method of the substrate shown in FIGS. 1 to 5 will be described.

FIG. 19 is a partial cross-sectional view of a solar cell manufactured using the texturing method of FIGS. 1 to 5. Referring to FIG. 19, a solar cell 1 according to an example embodiment includes a substrate 310, an emitter layer 320 on an incident surface (hereinafter, referred to as "a front surface") of the substrate 310, on which light is incident, first and second anti-reflection layers 331 and 332 (refer to FIG. 22) sequentially positioned on the emitter layer 320, a plurality of front electrodes 341 electrically connected to the emitter layer 320, a passivation layer 391 positioned on a rear surface of the substrate 310 opposite the front surface with respect to the substrate 110, a rear electrode conductive layer 355 positioned on the rear surface of the substrate 310, and a plurality of back surface fields (BSFs) 371 positioned between the rear electrode conductive layer 355 and the substrate 310. The passivation layer 391 includes a plurality of contact holes 381 exposing portions of the substrate 310. The rear electrode conductive layer 355 is positioned on the passivation layer 391 and the exposed portions of the substrate 310 through the contact holes 381.

In the example embodiment, the substrate 310 is formed of silicon doped with an impurity of a first conductive type, for example, a p-type. The substrate 310 is the same as that shown in FIGS. 1 to 5. Examples of silicon include single crystal silicon, polycrystalline silicon, and amorphous silicon. When the substrate 310 is a p-type, the substrate 310 contains an impurity of a group III element such as boron (B), gallium (Ga), and Indium (In).

Alternatively, the substrate 310 may be of an n-type, and be made of materials other than silicon. When the substrate 310 is the n-type, the substrate 310 may contain an impurity of a group V element such as phosphor (P), arsenic (As), and antimony (Sb). The substrate 310 includes a textured surface corresponding to an uneven surface, and a plurality of particles 314 are attached on the textured surface. In this embodiment, the plurality of particles 314 are made of the same material, that is, silicon (Si), as the substrate 310, The emitter layer 320 is positioned on the incident surface and side portions of the substrate 310. The emitter layer 320 is an impurity portion having a second conductive type (for example, an n-type) opposite the first conductive type of the substrate 310. The emitter layer 320 form a p-n junction along with the substrate 310.

A plurality of electron-hole pairs produced by light incident on the substrate 310 are separated into electrons and holes by a built-in potential difference resulting from the p-n junction. Then, the separated electrons move toward the n-type semiconductor, and the separated holes move toward the p-type semiconductor. Thus, when the substrate 310 is the p-type and the emitter layer 320 is the n-type, the separated holes move to the substrate 310 and the separated electrons move to the emitter layer 320. Accordingly, the holes in the substrate 310 and the electrons in the emitter layer 320 become major carriers.

Because the substrate 310 and the emitter layer 320 form the p-n junction, the emitter layer 320 may be of the p-type when the substrate 310 is of the n-type unlike the embodiment described above. In this case, the separated electrons move to the substrate 310 and the separated holes move to the emitter layer 320.

Returning to the embodiment in which the emitter layer 320 is the n-type, the emitter layer 320 may be formed by doping the substrate 310 with an impurity of a group V element such as P, As, and Sb. On the contrary, when the emitter layer 320 is of the p-type, the emitter layer 320 may be formed by doping the substrate 310 with an impurity of a group III element such as B, Ga, and In.

Next, the first and second anti-reflection layers 331 and 332 are sequentially positioned on the emitter layer 320 on the incident surface of the substrate 310. At this time, as shown in FIG. 19, since the plurality of particles 314 are attached on the textured surface of the substrate 310, the first anti-reflection layer 331 includes the plurality of particles 314 attached on the textured surface of the substrate 310.

Light reflected from the second anti-reflection layer 332 and the first anti-reflection layer 331 generates a destructive interface, to decrease the reflectance of light and increase selectivity at a predetermined wavelength of light. Accordingly, by the first and second anti-reflection layers 331 ad 332, the efficiency of the solar cell 1 improves. The first anti-reflection layer 331 may be made of silicon oxide (SiOx) and the second anti-reflection layer 332 may be made of silicon nitride (SiNx).

The plurality of front electrodes 341 are positioned on and electrically connected to the emitter layer 320. The plurality of front electrodes 341 are spaced apart from each other and extend in a predetermined direction. The front electrodes 341 collect charges (for example, electrons) moved to the emitter layer 320.

The front electrodes 341 are made of at least one conductive material. An example of the conductive materials may be at least one selected from the group consisting of nickel (Ni), copper (Cu), silver (Ag), aluminum (Al), tin (Sn), zinc (Zn), indium (In), titanium (Ti), gold (Au), and a combination thereof, but may be other conductive materials.

The passivation layer 391 positioned on the rear surface of the substrate 310 decreases the recombination of the charges due to unstable bonds such as dangling bonds near the surface of the substrate 310. Further, the passivation layer 391 increases the reflectance toward the substrate 310 of light passed through the substrate 310. The passivation layer 391 may have a single-layered structure or a multi-layered structure. The rear electrode conductive layer 355 made of a conductive material includes a plurality of rear electrodes electrically connected to the substrate through the contact holes 381.

Each of the rear electrodes 351 may include a plurality of conductors each which has various shapes such as a circle, an oval, and a polygon. The plurality of conductors are spaced apart from one another at a predetermined distance. However, in an alternative embodiment, each of the rear electrodes 351 may have a stripe shape electrically connecting to the substrate 310 and extending in a predetermined direction, similar to the front electrodes 341. The rear electrodes 351 collect charges (for example, holes) moved to the substrate 310 and transfer the collected charges to the rear electrode conductive layer 355.

The conductive material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

The plurality of BSFs 371 is positioned between the rear electrodes 351 and the substrate 310. The BSFs 371 are areas (for example, p+-type areas) that are more heavily doped with an impurity of the same conductive type as the substrate 310 than the substrate 310.

A potential barrier is formed due to an impurity doped concentration difference from the substrate 310 and each of the BSFs 371, and thereby, the movement of the electrons to the rear surface of the substrate 310 is disturbed by the potential barrier. Accordingly, the BSFs 371 prevent or reduce the recombination of the electrons and holes near the rear surface of the substrate 310.

An operation of the solar cell 1 of the above-described structure according to the example embodiment of the present invention will be described. When light irradiated to the solar cell 1 is incident on the substrate 310 through the second and first anti-reflection layers 332 and 331 and the emitter layer 320, a plurality of electron-hole pairs are generated in the substrate 310 by light energy based on the incident light. At this time, since the reflection loss of light incident on the substrate 310 is reduced by the first and second anti-reflection layers 331 and 332, an amount of light incident on the substrate 310 increases.

Further, since the substrate 310 has the textured surface, the reflectance of light from the incident surface of the substrate 310 decreases, and the light is confined within the solar cell 1 through the incident and reflection operations on the textured surface. Accordingly, the absorption of light is increased, and thereby the efficiency of the solar cell 1 is improved. In addition, since light is scattered by the plurality of particles 314 included into the first anti-reflection layer 331, the reflectance of light from the incident surface is further decreased to further improve the adsorption of light.

The electron-hole pairs are separated by the p-n junction of the substrate 310 and the emitter layer 320, and the separated electrons move to the n-type emitter layer 320 and the separated holes move to the p-type substrate 310. The electrons moved to the n-type emitter layer 320 are collected by the front electrodes 341. The holes moved to the p-type substrate 310 are collected by the rear electrodes 351 and then are transferred to the rear electrode conductive layer 355. When the front electrodes 341 are connected to the rear electrode conductive layer 155 using electric wires (not shown), current flows therethrough to thereby enable use of the current for electric power.

Next, referring to FIGS. 20 to 27, a method of manufacturing the solar cell 1 according to the example embodiment of the preset invention will be described. FIGS. 20 to 27 are cross-sectional views sequentially showing each of steps in a manufacturing method of the solar cell of FIG. 19.

Figure 20:
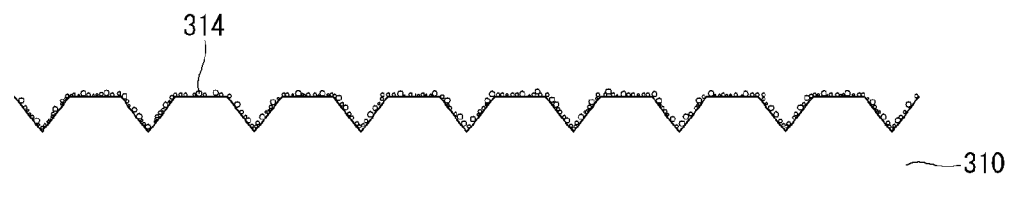
FIGS. 20 to 27 are cross-sectional views sequentially showing each of steps in a manufacturing method of the solar cell of FIG. 19.
Figure 21:
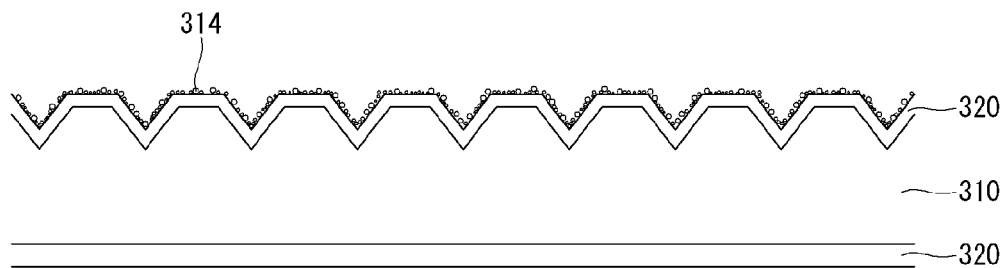

First, referring to FIG. 20, after the texturing a surface of a substrate 310 as described above referring to FIGS. 1 to 3, a plurality of particles 314 are attached on the textured surface as shown in FIGS. 4 and 5. Next, as shown in FIG. 21, a high temperature thermal process is performed on the substrate 310 of a p-type silicon in an environment containing a material (for example, $PH_3POCl_3$ or $H_3PO_4$) including an impurity of a group V element such as P, As, and Sb, to diffuse the impurity of the group V element into the substrate 310 and to thereby form an emitter layer 320 on the entire surface of the substrate 210, that is a front surface, a rear surface, and a side surface.

Unlike this embodiment, when the conductive type of the substrate 310 is an n-type, the thermal process is performed in the environment containing a material (for example, $B_2H_6$) including an impurity of a group III element, to form the emitter layer 320 of a p-type into the substrate 110.

Then, phosphorous silicate glass (PSG) containing phosphor (P) or boron silicate glass (BSG) containing boron (B) produced when the p-type impurity or the n-type impurity is diffused inside the substrate 110 is removed through an etching process.

Figure 22:
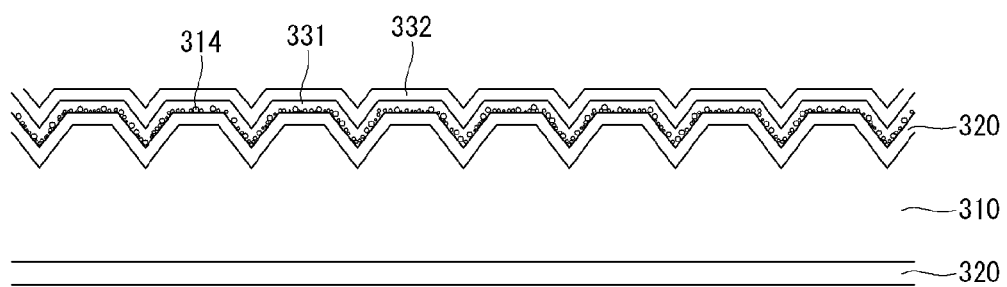

Next, referring to FIG. 22, first and second anti-reflection layers 331 and 332 performing a plasma enhanced chemical vapor deposition (PECVD), etc., are sequentially formed on the emitter layer 320 on which the plurality of particles 314 are attached. A thickness of the first anti-reflection layer 331 contacted with the substrate 310 is larger than sizes of the particles 314 such that the first anti-reflection layer 331 entirely covers the plurality of particles 314 to stably prevent the reflection of light along with the second anti-reflection layer 332.

Figure 23:
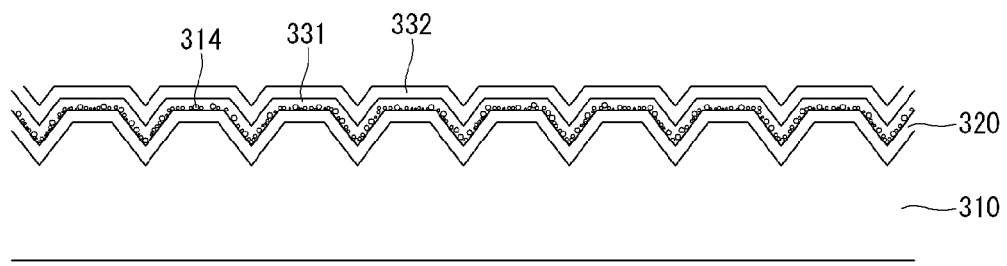

Sequentially, as shown in FIG. 23, the rear surface of the substrate 310 is removed to remove a portion of the emitter layer 320 formed on the rear surface of the substrate 310.

Figure 24:
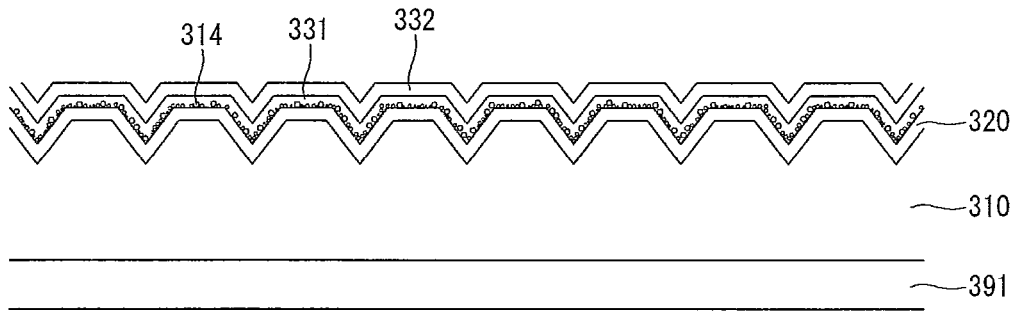

As shown in FIG. 24, a passivation layer 391 is formed on the rear surface of the substrate 310 using various methods such as a PECVD or a sputtering process. The passivation layer 391 may have a single layered structure such as a silicon oxide (SiOx) film or a multi-layered structure including a silicon oxide (SiOx) film and a silicon nitride (SiNx) film.

Figure 25:
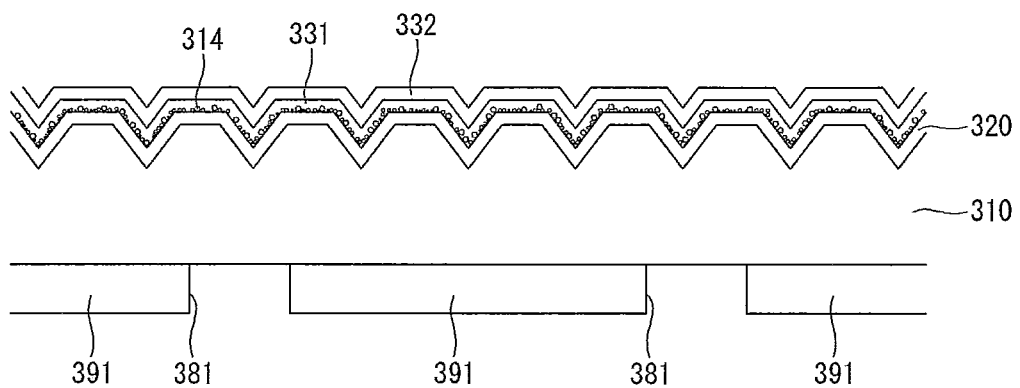

Referring to FIG. 25, a plurality of contact holes 381 are formed in portions of the passivation layer 391 using a laser beam, etc., to exposes portions of the substrate 310. At this time, the intensity and a wavelength of the laser beam are defined based on a material, a thickness, and so on of the passivation layer 391.

Figure 26:
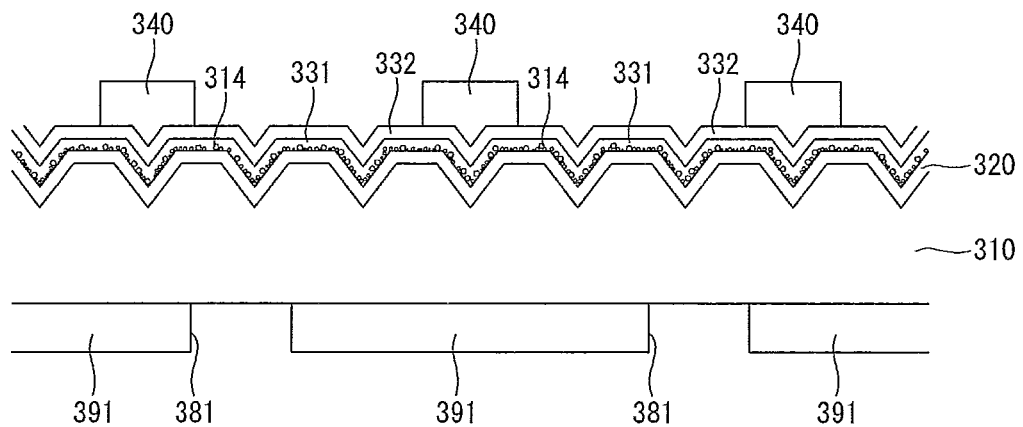
Figure 27:
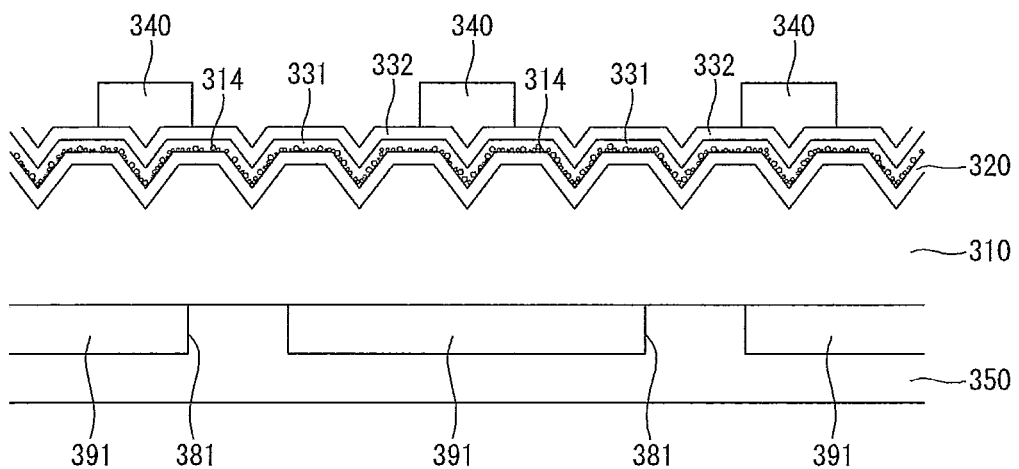

As shown in FIGS. 26 and 27, a paste containing Ag is applied on corresponding portions of the second anti-reflection layer 332 and then dried to form a front electrode pattern 340, and a paste containing Al is applied on the passivation layer 391 and the exposed portions of the substrate through the contact holes 381 and then dried to form a rear electrode conductor pattern 350. At this time, the patterns 340 and 350 may be applied by a screen printing and a formation order of the patterns 340 and 350 may be changed, or the formation of the patterns 340 and 350 may occur together.

Then, the substrate 310 with the patterns 340 and 350 is fired to form a plurality of front electrodes 341, a rear electrode conductor 355 including a plurality of rear electrodes 351 that are electrically connected to the substrate 310 through the contact holes 381, and a plurality of BSFs 371. As a result, the solar cell 1 shown in FIG. 19 is completed.

More specifically, when the thermal process is performed, contacted portions of the anti-reflection layers 332 and 331 and the front electrode pattern 340 are sequentially passed due to elements such as Pb contained in the front electrode pattern 340 and are contacted with the emitter layer 320 to form the plurality of front electrodes 341. In addition, portions of the rear electrode conductor pattern 350 are connected to the exposed portions of the substrate 310 through the contact holes 381 to form the plurality of rear electrodes 351. Moreover, metal components contained in each of the patterns 340 and 350 chemically couples with the contacted layers 320, 310, and 391 and thus a contact resistance is reduced to improve a current flow.

Further, during the thermal process, Al contained in the rear electrodes 351 is diffused into the substrate 310 contacting the rear electrodes 351 to form the plurality of BSF 371 between the rear electrodes 351 and the substrate 310. In this case, the BSFs 371 are areas doped with an impurity of the same conductive type as the substrate 310, for example, a p-type impurity. An impurity doping concentration of the BSFs 371 is greater than an impurity doping concentration of the substrate 310, and thus the BSFs 371 are $p^+$-type areas.

In an alternative embodiment, the BSFs 371 may be formed using a separate process. For example, after forming the plurality of contact holes 381 in the passivation layer 391, an impurity of the same conductive type as the substrate 310 is heavily injected into the substrate 310 through the contact holes 381 to form the BSFs 371. At this time, the passivation layer 391 is used as a mask.

In another alternative embodiment, after the formation of the passivation layer 391, the front electrode pattern 340 and the rear electrode pattern 350 may be applied on the second anti-reflection layer 332 and the passivation layer 391, respectively. Next, a laser beam may be irradiated to corresponding portions of the rear electrode conductor pattern 350 to melt the corresponding portions of the rear electrode conductor pattern 350 and the underlying substrate 310. Then, by firing the substrate 310, the front electrodes 341 electrically connected to the emitter layer 320 and the rear electrode conductor 355 having a plurality of rear electrodes 351 that are electrically connected to the substrate 310 may be formed to complete the solar cell 1.

Figure 28:
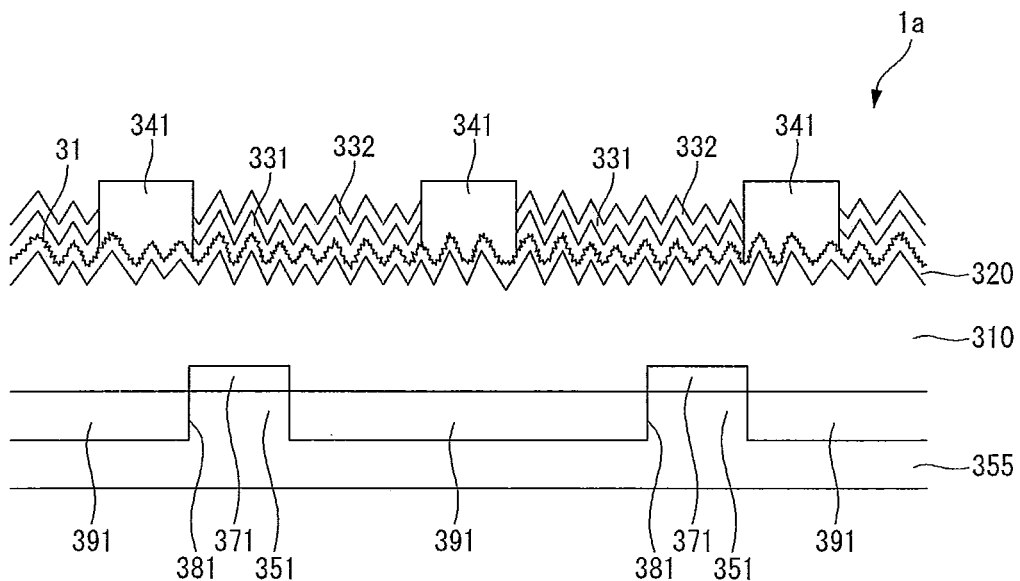
FIG. 28 is a partial cross-sectional view of a solar cell manufactured using the texturing method of FIGS. 8 to 12 and FIGS. 17 and 18.

Next, referring to FIG. 28, a solar cell using the texturing method shown in FIGS. 8 to 12, 17, and 18 will be described. FIG. 28 is a partial cross-sectional view of a solar cell manufactured using the texturing method of FIGS. 8 to 12 and FIGS. 17 and 18. As compared to FIG. 19, elements performing the same operations are indicated as the same reference numerals, and the detailed description thereof is omitted.

A solar cell 1a shown in FIG. 28 has the same structure as the solar cell 1 shown in FIG. 19, except for a shape of a textured surface. That is, referring to FIG. 28, the solar cell 1a includes a substrate 310, an emitter layer 320 positioned on an incident surface of the substrate 310, first and second anti-reflection layers 331 and 332 sequentially positioned on the emitter layer 320, a plurality of front electrodes 341 electrically connected to the emitter layer 320, a passivation layer 391 positioned on a rear surface of the substrate 310 opposite the incident surface with respect to the substrate 310 and including a plurality of contact holes 381, a rear electrode conductor 355 positioned on the passivation layer 391 and exposed portions of the substrate 310 through the contact holes 381 and including a plurality of rear electrodes 351, and a plurality of BSFs 371 positioned between the plurality of rear electrodes 351 and the substrate 310.

However, in difference with FIG. 19, the solar cell 1a further includes a plurality of depressions 31 on the textured surface of the substrate 310. Accordingly, the reflectance of light incident on the substrate 310 is largely decreased to increase an incident amount of light.

A manufacturing method of the solar cell 1a is also equal to that described above with reference to FIGS. 21 to 27, except for the method described referring to FIGS. 8 to 12, 17, and 18, and thereby the detailed description of the method of manufacturing the solar cell 1a is omitted.

In the embodiments, the solar cells 1 and 1a include the passivation layer 391 on the rear surface of the substrate 310, but the embodiments may be applied to solar cells of other types. For example, a solar cell need not include the passivation layer 391. In this case, a rear electrode is directly formed on the rear surface of the substrate to be electrically connected to the substrate without a plurality of contact holes and a BSF is formed between the rear electrode and the substrate by the thermal process.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A texturing method of a solar cell, the method comprising:
    forming a textured surface on a silicon semiconductor substrate for the solar cell to provide a plurality of projected portions;

forming a particle formation layer on the textured surface of the silicon semiconductor substrate by sputtering or chemical vapor decomposition, the particle formation layer comprising a particle formation material and a medium material; and leaving mainly a plurality of particles of the particle formation material on the textured surface of the silicon semiconductor substrate by removing the medium material from the particle formation layer, wherein the particle formation material is the same material as the silicon semiconductor substrate and the medium material comprises a plurality of metal particles.

2. The texturing method of claim 1, wherein the medium material is about 90 wt % to 99 wt % based on the total weight of the particle formation material and the medium material, and the particle formation material is about 10 wt % to 1 wt % based on the total weight of the particle formation material and the medium material.

3. The texturing method of claim 1, wherein the medium material is removed using an etchant.

4. The texturing method of claim 3, wherein the medium material is removed at about 25° C. to 50° C.

5. The texturing method of claim 1, wherein a thickness of the particle formation layer formed on the textured surface of the silicon semiconductor substrate is based on a diameter of each of the plurality of particles.

6. The texturing method of claim 5, wherein the diameter of each of the plurality of particles is less than a predetermined wavelength band of light incident on the silicon semiconductor substrate.

7. The texturing method of claim 6, wherein the diameter of each of the plurality of particles is about 50 nm to 300 nm.

* * * * *